United States Patent

[11] 3,632,435

[72] Inventors Lars Eriksson
Segeltorp;
Ali Godhan, Alvsjo, both of Sweden

[21] Appl. No. 835,807
[22] Filed June 23, 1969
[45] Patented Jan. 4, 1972
[73] Assignee AB Gylling & Co.
Stockholm, Sweden
[32] Priority July 12, 1968
[33] Sweden
[31] 9610/68
Continuation-in-part of application Ser. No. 746,246, July 22, 1968, now abandoned. This application June 23, 1969, Ser. No. 835,807

[54] PREPARATION OF SUBSTRATE FOR ELECTROLESS DEPOSITION
12 Claims, No Drawings

[52] U.S. Cl. .......... 117/212, 117/47 R
[51] Int. Cl. .......... B44d 5/00
[50] Field of Search .......... 117/47, 102, 160, 212

[56] References Cited

UNITED STATES PATENTS

| | | | |
|---|---|---|---|
| 3,347,724 | 10/1967 | Schneble et al. .......... | 117/47 X |
| 3,406,036 | 10/1968 | McGrath et al. .......... | 117/160 X |

*Primary Examiner*—Alfred L. Leavitt
*Assistant Examiner*—Caleb Weston
*Attorney*—Burns, Doane, Swecker & Mathis

ABSTRACT: An improved process is provided for preparing a substrate to receive a metal coating (e.g. copper) over a selected area of its surface by electroless deposition. A substrate is provided with areas of divergent surface characteristics with respect to the retention of a colloidal material, and a coating of a colloidal material is applied to the same which is subsequently subjected to a destabilizing medium (i.e. a stripper) for a time sufficient to substantially remove the colloidal material from those areas in which no electroless deposition is desired. For example, the colloidal material may be (1) a colloidal stannous salt (e.g. stannous chloride), or (2) a colloidal noble metal applied from bath containing a stannous salt (e.g. stannous chloride) and a noble metal salt (e.g. palladium chloride). In (1) a noble metal salt is subsequently contacted with the colloidal coating of stannous salt and is reduced to a colloidal noble metal. The colloidal noble metal at selected areas of the surface of the substrate is catalytic to the deposition of the metal to be deposited electrolessly. Suitably destabilizing media for the removal of a portion of the colloidal material from the surface of the substrate include solutions of strong electrolytes (e.g. basic lead carbonate, ferric chloride, and aluminum sulfate). When the colloidal material is a colloidal noble metal applied from a bath containing both a stannous salt and a noble metal salt, the particularly preferred destabilizer is an organic compound which is capable of removing the noble metal (e.g. palladium). The present process is particularly suited for preparing a substrate, such as a printed circuit card, having through holes so that the walls of the holes as well as other predetermined areas may selectively receive a metal coating by electroless deposition.

PREPARATION OF SUBSTRATE FOR ELECTROLESS DEPOSITION

CROSS-REFERENCE TO RELATED APPLICATION

This is a continuation-in-part of our copending Ser. No. 746,246, filed July 22, 1968 (now abandoned).

BACKGROUND OF THE INVENTION

As is known in the art, electroless deposition involves the plating of a metal over a sensitized or activated surface of a substrate in the absence of an external electric current. Electroless deposition is particularly useful in the fabrication of printed circuit boards in which a metal, such as copper, is applied to a substrate in a predetermined pattern. Following electroless deposition the resulting metallic coating may serve as a cathode upon which conventional electroplating may be conducted to produce a conductive metallic pattern of increased thickness.

Representative United States patents disclosing electroless metal deposition include: U.S. Pat. Nos. 3,011,920 to Shipley, Jr.; 3,075,855 to Agens; 3,075,856 to Lukes; and 3,119,709 to Atkinson, which are herein incorporated by reference.

In order for a substrate to receive a metal deposit by way of electroless deposition, it is necessary to first sensitize or activate the substrate in those areas where the metal deposit is desired. A colloidal material is first applied to at least a portion of the surface of the substrate to insure that the chemical reduction of the metal electrolessly applied takes place at the surface of the substrate, and/or the metal electrolessly applied otherwise adheres to the surface of the substrate. Activation may be accomplished as is known in the art, for example, by (1) immersing a suitable substrate in an acidic aqueous solution of colloidal stannous chloride or other stannous salt, followed by (2) immersion of the substrate bearing a coating of the stannous salt in a bath containing a salt of a noble metal, e.g. silver nitrate, or chlorides of gold, palladium or platinum, etc. Alternatively, one may employ a single sensitizing bath, to apply the activating colloid, e.g. an acidic aqueous bath containing stannous chloride and a salt of a noble metal such as described in U.S. Pat. No. 3,011,920.

It is believed that the activated surface bearing the colloidal material consists of a series of nucleating centers which are particularly adapted to receive the metal deposited electrolessly. The activating colloid is accordingly adsorbed onto the surface of the substrate as a series of nuclei for the seeding of the metal (e.g. copper) which is applied electrolessly.

The electroless deposition solution usually comprises a salt of nickel, cobalt, copper, silver, gold, chromium, or members of the platinum family and a reducing agent therefor. The activating colloid previously applied to the substrate is a material known to catalyze the desired electroless deposition.

Heretofore the application of a selected pattern to a substrate by way of electroless deposition has been tedious and time consuming largely because of difficulties inherent in known techniques for providing the activating colloid upon the surface of the substrate in the desired image. For instance, it has heretofore been common to employ various mechanical techniques to remove nondesired metallic deposit after the electroless deposition, or to cover the previously sensitized or activated substrate prior to electroless deposition with a mask on those areas where no deposit is wanted. Alternatively, a mask may be provided on the substrate prior to immersion in the bath containing the activating colloid, and be subsequently removed prior to electroless deposition.

In U.S. Pat. No. 3,347,724 to Schneble, Jr., a technique is disclosed in which a substrate is provided with a resinous coating containing an activating material prior to electroless deposition. A pattern is then applied by use of a light-sensitive photoresist. Electroless deposition of the resulting substrate has required excessively long periods, e.g. 2 hours, however, due to the fact the activating material is imbedded in a resinous binder and not readily accessible.

In addition to requiring substantial labor and material expenditures these prior techniques used in the preparation of a substrate have generally not proven accurate and reliable enough for the production of a high-quality product.

It is an object of the invention to provide an improved process for preparing a substrate to receive a metal coating over a predetermined area of its surface by way of electroless deposition.

It is an object of the invention to provide a rapid and efficient process for preparing a printed circuit substrate to receive a conductive coating over a predetermined area of its surface by way of electroless deposition.

It is another object of the invention to provide an efficient process which is particularly suited for preparing a printed circuit substrate to selectively receive a metal coating upon the walls of the holes present therein by way of electroless deposition.

It is another object of the invention to provide a process useful in the production of printed circuit boards which is particularly amenable to high-volume production.

It is a further object of the invention to provide an improved process for preparing a substrate to receive a metal coating upon its surface by way of electroless deposition in which such deposition may be conducted through the use of conventional electroless deposition baths.

It is a further object of the invention to provide an improved process for preparing a substrate to receive a metal coating over a predetermined surface area by way of electroless deposition in which good deposition selectivity is achieved.

These and other objects of the invention, as well as the scope, nature, and utilization of the invention will be apparent from the following detailed description and appended claims.

SUMMARY OF THE INVENTION

It has been found that an improved process in the preparation of a substrate to receive a metal coating over a selected area of its surface through electroless deposition comprises:

a. providing a substrate having areas of divergent surface characteristics consisting essentially of
    1. an area having a substantial tendency to retain a colloidal material, and
    2. an area having no substantial tendency to retain a colloidal material,
b. coating said substrate with a colloidal material,
c. exposing the resulting substrate bearing said coating of said colloidal material to the action of a destabilizing medium for a time sufficient to substantially remove said colloidal material from said area having no substantial tendency to retain the same while preserving a coating of said colloidal material on said area having a substantial tendency to retain the same.

In a preferred embodiment of the invention the colloidal material is a noble metal catalytic to the metal to be deposited electrolessly, and is destabilized upon contact with a solution containing an organic compound capable of selectively removing the same.

DETAILED DESCRIPTION OF THE INVENTION

The present invention provides an expeditious process for preparing a substrate to receive a metal coating over a selected portion of its surface by way of electroless deposition. The process is useful in the production of printed circuits in which a conductive pattern is adheringly positioned upon the surface of a suitable substrate. For instance, through holes, as well as other surface areas of a substrate of the type commonly used in the production of printed circuits may be efficiently provided with a colloidal coating of a predetermined pattern prior to electroless deposition.

The Substrate

The substrate treated in accordance with the process of the present invention may be of varied composition. Conventional substrates commonly used in the production of printed circuit boards by prior art techniques may be selected. The substrate may be a dielectric material consisting primarily of a resinous material. If desired the resinous material may incorporate fibrous reinforcement. For instance, paper or cardboard, glass fiber or other fibrous material, may be impregnated with a phenolic, epoxy, or fluorohydrocarbon (i.e. Teflon) resinous material, and pressed or rolled to a uniform thickness. Ceramic substrates may likewise be selected. Also, the substrate may optionally be metal clad, e.g. copper clad, on one or more of its surfaces.

It is recommended that the substrate after its formation, i.e. after mechanical shaping, be cleaned or degreased. Degreasing may be accomplished in organic or alkaline solvents according to procedures known in the art. Chlorinated hydrocarbons may be conveniently employed, such as methylchloroform or trichloroethylene. Additionally, degreasing may be conveniently conducted at a moderately elevated temperature, e.g. 45° to 55° C., in 1 to 5 minutes in an alkaline detergent, such as Enthone Cleaner No. 99, available commercially from Enthone, Inc. of New Haven, Connecticut.

When the substrate is metal clad on at least a portion of its surface, the cleaning may be carried out electrolytically employing the above-mentioned alkaline detergent at a current density of approximately 3 amperes per square decimeter (approximately 0.3 ampere/foot$^2$) of metal surface.

Additionally, the surface of the substrate may be immersed in an ammonium persulfate solution in order to reduce any copper oxide and to modify its surface to impart a negative charge, rinsed with water, immersed in a dilute sulfuric acid solution which imparts a positive surface charge, and again rinsed in water. Other techniques which are known in the art may also be used to impart a positive charge to the substrate.

Application of Divergent Surface Characteristics to the Substrate

The cleaned and degreased substrate is next provided with areas of divergent surface characteristics consisting essentially of (1) an area having a substantial tendency to retain a colloidal, and (2) an area having no substantial tendency to retain a colloidal material. Those portions of the substrate surface which are intended to eventually receive a metal coating electrolessly are rendered substantially more retentive to a colloidal material than the remaining portions of the substrate surface. More specifically, when preparing a substrate intended for use as a support for a printed circuit, those surface areas which are to ultimately support the conductive circuit are rendered relatively more retentive to a colloidal material.

The available techniques for rendering a selected area of the substrate surface relatively more retentive to a colloidal material are many as will be apparent to those skilled in the art. Any technique capable of imparting limited roughness or porosity to a portion of the substrate surface while concomitantly preserving or imparting relatively smooth or glossy characteristics to the remaining portion of the substrate surface may be selected. Surface roughness is believed to make possible a greater and more tenacious adsorption of the colloidal material upon the surface. Such colloidal material while present upon a surface having a substantial ability to retain the same is also relatively more resistant to destabilization or stripping in a subsequent step of the present process as described hereafter.

It has been found, for instance, from observing that surface scratches upon the surface of a printed circuit board have a tendency to retain colloidal material, that mechanical abrasion can be employed to impart the desired colloidal retention characteristics. Such a mechanical abrasion can, of course, be imparted by a variety of techniques which will be apparent to those skilled in the art, including roughening of the surface with a sharp object, a steel brush abrasion wheel, or sanding. If desired, a pattern may be temporarily superimposed over the substrate to precisely delineate the surface area to be abraded.

It has been surprisingly found that the walls of holes punched or drilled in a resinous printed circuit board by conventional techniques commonly inherently possess the requisite colloidal material retention characteristics when compared with the other surfaces of the board. For instance, it is common for the surfaces of a printed circuit substrate to exhibit a smooth or glossy characteristic which is produced either (1) during the formation of the board by compression or rolling, or (2) by a subsequent treatment, e.g. polishing or doping. Such techniques commonly also lead to a substrate having more dense surface characteristics, and it is common for the surfaces of such conventionally prepared boards to exhibit a surface roughness of about 4 to 8 $\mu$m. in the absence of additional surface treatment. When holes are drilled or punched in the substrate in a conventional manner their walls commonly exhibit the requisite surface roughness differential. For instance, a surface roughness of 8 to 16 $\mu$m. is commonly exhibited by the wall surfaces of the through holes. Care should be taken when drilling holes that the drill does not travel at such an excessive rate that the walls of the holes are raised to a highly elevated temperature and are thereby caused to assume a configuration having highly glossy surface characteristics. Optimum results have been obtained in the present process when the hole walls have a surface roughness of about 12 $\mu$m. It is further believed that the walls of the holes are commonly better able to retain a colloidal material applied thereto because they are formed of a less dense composition and have not been subjected to rolling or surface compression.

When the substrate surface has a roughness or other surface characteristic conducive to the retention of a colloidal material in areas where no electroless deposition is desired, then the colloidal retention characteristics may be effectively dissipated by imparting smoothness to the exposed surface. For instance, a resinous lacquer may be applied which superimposes a smooth film upon the surface (e.g. a hard glossy surface having a roughness of about 1 $\mu$m. or less). Waxing or polishing techniques may likewise be employed to eliminate surface roughness. Doping may be selected in which a portion of the resinous surface of the substrate is dissolved in a solvent for the same and optionally redeposited as a smooth layer upon the evaporation of the solvent. It is preferred that those areas where no electroless deposition is desired exhibit a hard glossy surface, while the remaining areas exhibit a significantly greater liquid adsorption ability which is manifest in a greater tendency to retain colloidal material.

Coating of Colloidal Material

A coating of a colloidal material is applied to the substrate to further the sensitization or activation of the same for the electroless deposition of a metal, such as copper. The colloidal material applied to the substrate may be selected from colloids conventionally used in the activation of a support for electroless deposition. As described hereafter, the activation of the substrate may be conducted in either one or more steps.

When a one step activation procedure is utilized, the surface of the substrate is contacted with an acidic aqueous bath containing a mixture of a noble metal salt and a reducing agent for the noble metal cation. A colloidal material which is catalytic to the metal to be deposited electrolessly is coated upon the surface of the substrate. Illustrative examples of such baths from which the catalytic colloid may be applied are disclosed in U.S. Pat. No. 3,011,920, the subject matter of which is herein incorporated by reference. Prior to the actual electroless deposition the catalytic colloid is selectively removed from those areas where no metallic deposit is desired by the action of a destabilizing medium as described hereafter.

Alternatively, a colloidal material such as a metallic salt, capable of reducing a noble cation, e.g. a colloidal stannous salt, may initially be applied from a bath containing the same to coat the substrate. While such a metallic salt alone is not generally catalytic to the metal which is to be applied electrolessly, it may subsequently be contacted with an additional bath containing a salt of a noble metal, and the substrate accordingly activated as the cation of the noble metal salt is reduced and deposited upon the substrate at the same location previously occupied by the colloidal metallic salt prior to the oxidation of is cation. In such instances the destabilizing or stripping step described hereafter would generally be conducted prior to contacting the substrate bearing the colloidal coating with the second bath containing the noble metal salt and the rendering of its surface catalytic to the deposition of the metal to be applied electrolessly.

The colloidal metallic salt which is applied to the surface of the substrate is lyophobic, and preferably hydrophobic. Stannous salts, such as stannous chloride ($Sn\ Cl_2$), are preferred colloidal materials commonly used in the preparation of a substrate for electroless deposition. Such colloids may be applied to a substrate while suspended in a dilute aqueous hydrochloric acid solution. A colloidal metallic salt, such as stannous chloride, serves to prepare the surface of the substrate to receive a noble metal. As is known in the art, stannous chloride while present in aqueous hydrochloric acid does not form a true solution, but rather a colloidal suspension which may be termed a sol. The stannous cations are complexed with anions within the sol. Each of the colloidal particles of the sol may be pictured as a core, an inner region surrounding the core consisting primarily of $Sn^{+2}$ (stannous ions), an intermediate region consisting of a mixture of $Sn^{+2}$ and $Cl^-$ (chloride ions), and finally an outer shell consisting of chloride ions. In each sol particle the electrical forces are in equilibrium; however, the particles show a negative net charge due to the prevalence of negative chloride ions on the surface. The individual particles thus repel each other and in this manner resist coagulation while in the suspension.

Upon contact with the surface of the substrate a coating or film of a colloidal material is effectively deposited thereupon. When the surface of the substrate is positively charged the colloidal film is not merely deposited thereon, but is electrically attached to the surface. The colloidal material will tend to be deposited over the complete surface of the substrate immersed therein with the greatest degree of deposition commonly taking place where the greatest surface area is presented, i.e. where the surface bears a limited roughness described previously.

Following destabilization (as described in detail hereafter) and rinsing the substrate bearing the colloidal metallic salt at selected areas is contacted with a bath containing a reducible noble metal salt. Palladium chloride, as the preferred noble metal salt, is commonly provided in a minor concentration in a dilute aqueous hydrochloric acid. For example, about 0.2 to 3 grams of palladium chloride may be provided per liter of water to which 5 ml. of hydrochloric acid is added. Palladium chloride is usually the most economical and reliable of the noble metal salts. Treatment baths containing other noble metal salts such as platinum chloride, gold chloride, silver nitrate, rhodium chloride, etc. may likewise be selected. Salts of the precious metals, silver, gold, palladium and platinum are preferred. Upon contact with the colloidal material (e.g. stannous chloride) previously applied to the substrate the noble metal salt is reduced to metallic form and deposited as a very thin layer, e.g. a thickness of 0.1 $\mu$m. on the substrate. The palladium or other noble metal activates the substrate and serves as a base for the metal (usually copper) to be applied chemically (i.e. electrolessly).

When employing a one step surface activation procedure, such as described in U.S. Pat. No. 3,011,920, the substrate may be coated with a colloidal layer deposited from a bath containing a colloidal stannous salt, such as stannous chloride, and a noble metal salt, such as palladium chloride. Subsequent to the destabilization step described hereafter it will accordingly be unnecessary to apply a further layer of a noble metal salt. Suitable one step surface activating baths such as described in the above-identified patent are available commercially from the Shipley Company, Inc. of Newton, Massachusetts under the designations "6F" and "9F." Such baths contain stannous chloride, palladium chloride, aqueous hydrochloric acid, and possibly a stabilizing agent such as sodium stannate. Colloidal palladium is formed by the reduction of the palladium ions by the stannous ions of the stannous chloride. Simultaneously, stannic acid colloids are formed together with adsorbed stannic oxychloride and stannic chloride. The stannic acid colloids comprise protective colloids for the palladium colloids while the oxychloride constitutes a deflocculating agent further promoting the stability of the resulting colloidal solution. The relative amounts of the above ingredients can be varied provided the pH is below about 1 and provided excess stannous ions are maintained.

Selective Destabilization

Prior to electroless deposition the substrate bearing a coating of the colloidal material heretofore described is exposed (e.g. by immersion or spraying) to a destabilizing medium or stripper for a time sufficient to substantially remove colloidal material from the surface area having no substantial tendency to retain the same while preserving a coating of the colloidal material on the surface area having a substantial tendency to retain the same. When a one-step activation procedure has been employed, it is essential that the noble metal portion of the colloid which is catalytic to the metal to be deposited electrolessly be essentially completely removed from predetermined areas, while any noncatalytic portions of the colloidal material may remain thereon. When the coating of colloidal material consists solely of stannous chloride, or other similar compound, it is essential that this colloidal coating be essentially completely removed from predetermined areas. A variety of destabilizing solutions may be selected for use in the present process.

It has been found that a simple colloidal coating such as a coating of colloidal stannous chloride can be removed more readily than a more complex colloid which is catalytic to the metal to be applied electrolessly, such as that applied from a bath described in U.S. Pat. No. 3,011,920.

Solutions containing strong electrolytes, i.e. strongly dissassociated inorganic compounds may be selected as the destabilizing medium. The strong electrolytes utilized as strippers preferably contain polyvalent hydrolyzable metal ions and have a higher place in the Table of Elements than the metal upon which the colloidal material is based. The electrolytes are commonly provided in acid solutions, and the pH is adjusted so that the destabilization will take place at a comparatively mild rate. The polyelectrolytes react with colloidal material (e.g. stannous chloride) to form reaction products which tend to be insoluble in the destabilization bath and chemically inert with respect to the substrate. Illustrative examples of polyelectrolytes include basic lead carbonate, $2PbCO_3 \cdot Pb(OH)_2$; ferric chloride, $FeCl_3$; and aluminum sulfate, $Al_2(SO_4)_3$. The activity of some of these compounds as destabilizing media in aqueous solutions can be attributed at least in part to their ability to enter into oxidation-reduction reactions in which $Sn^{+2}$ is oxidized to $Sn^{+4}$. The destabilizing baths may be provided at ambient temperature, e.g. 25° C. Rinsing of the substrate is not essential prior to destabilization of the colloidal material.

Basic lead carbonate in the presence of aqueous hydrochloric acid reacts with colloidal stannous chloride to form the following essentially insoluble compounds: tin hydrochloride, $Sn(OH)Cl$; tin hydroxide, $Sn(OH)_2$; and lead chloride, $PbCl_2$. In addition carbon dioxide and water are formed. The basic lead carbonate destabilization medium preferably is an aqueous solution of basic lead carbonate and hydrochloric acid comprising about 1 to 10 grams of basic lead carbonate and about 1 to 10 ml. of hydrochloric acid per liter of water. Suitable exposure times to the basic lead carbonate solution are about 1 to 10 minutes and preferably about 3 minutes.

Ferric chloride and aluminum sulfate solutions effectively overcome the zeta potential of the colloidal coating and oxidize stannous ions, $Sn^{+2}$, to the stannic state, $Sn^{+4}$. Ferric ion, $Fe^{+3}$, is accordingly reduced to ferrous ion, $Fe^{+2}$. The ferric chloride is preferably present in a solution having a pH of about 2 to 5. $Al^{+3}$ ion derived from aluminum sulfate, $Al_2(SO_4)_3$ may be similarly reduced preferably at a pH of about 7 to 8.

In a particularly preferred embodiment of the invention in which the coating of colloidal material may be applied from a bath containing a stannous salt and a noble metal salt, such as described in U.S. Pat. No. 3,011,920, the noble metal is stripped from selected areas of the substrate by contact with a solution of an organic compound. If desired an organic compound may be selected which acts primarily upon the noble metal (e.g. palladium) of the colloidal coating as described hereafter. Such organic destabilizing compounds exhibit particularly good selectivity even when differences in the surface roughness of the substrate are relatively small. Additionally, the colloidal material present upon the surface area having no substantial tendency to retain the same is removed within reasonable exposure times. The exact reason for the effectiveness of the organic compounds described hereafter, as well as for similarly functioning compounds which will be apparent to those skilled in the art, is not completely understood, since the reactions in the colloidal layer are not known in detail. However, insights into the reaction mechanisms as far as understood are described hereafter in an attempt to explain the destabilization selectivity observed.

Suitable destabilizing media which utilize an organic compound include solutions of dibasic carboxylic acids (i.e. dicarboxylic acids) having the general formula:

$$\begin{array}{c} COOH \\ | \\ (CH_2)_n \\ | \\ COOH \end{array}$$

wherein *n* is a whole number from 1 to about 8. Illustrative examples of such dicarboxylic acids include: oxalic acid, malonic acid, succinic acid, glutaric acid, etc. Oxalic acid is the particularly preferred dicarboxylic acid for use in the present process. Aqueous solutions of oxalic acid may serve as the destabilizing medium which are formed by dissolving about 2 to 50 grams of oxalic acid per liter of water. Such solutions can serve as an excellent stripper for colloidal material present upon a wide variety of substrates, i.e. resinous substrates, ceramic substrates, etc. Exposure or treatment times when employing solutions of the above concentration commonly range from about 20 seconds to 5 minutes. Preferably the concentration of the dicarboxylic acid is adjusted so that the colloidal material present upon those areas of the substrate having no substantial tendency to retain the same is removed after about 1 to 3 minutes of exposure, e.g. by immersion of the substrate bearing the colloidal material in the solution. In a particularly preferred embodiment of the invention the destabilizing medium is formed by dissolving about 30 grams oxalic acid per liter of water.

Oxalic acid is believed to form oxalates with metals present in the coating of colloidal material positioned upon the surface of the substrate. For instance, it has been observed that oxalic acid forms insoluble palladium oxalates and soluble tin oxalates when employing a solution of oxalic acid having an appropriate concentration and pH. The resulting oxalates may be generally exemplified by the following formula where M is derived from metals (e.g. palladium or tin) present in the colloidal material:

$$\begin{array}{ccccccc} O=C & - & O-M-O & - & C=O \\ | & & & & | \\ HO-C=O & & & & O=C-OH \end{array}$$

The right- and left-hand oxalate groups need not be stereoisomers of each other, but are shown in the above manner for the sake of simplicity. One or both of the carboxyl groups illustrated may be ionized, i.e. hydrogen may be removed from one or more of the —OH portions of the same, and thus form chains of polymers of variable length with metal ions.

Aqueous acidic solutions of anthranilic acid (orthoaminobenzoic acid), $C_6H_4(NH_2)(COOH)$ may be selected as the destabilizing medium. A minor amount of anthranilic acid may be dissolved in dilute hydrochloric acid, and used as the stripper. This compound is believed to react with palladium and tin present in the colloidal coating in a manner directly analogous to the dicarboxylic acids and to form palladium anthranilane and tin anthranilane while yielding the desired selectivity. While the exact mechanism is uncertain, most probably the —OH bond of the carboxyl group is severed and palladium anthranilane of the following structure is formed:

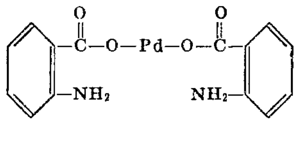

Since the presence of a colloidal material which is catalytic to the metal which is to be deposited electrolessly is essential for the electroless deposition of a metal to occur, it is possible to select a destabilizing medium or stripper which acts only upon the catalytic portion of the colloidal coating. For example, a stripper may be selected which acts only upon the noble metal colloid (e.g. palladium).

A class of organic compounds which when in solution may be satisfactorily employed as a destabilizing medium which acts only upon the noble metal (e.g. palladium) is the dioximes. For example, the dioximes may be satisfactorily dissolved in organic solvents, e.g. ethyl alcohol or isopropyl alcohol, in a concentration of about 0.5 to 10 percent by weight to form destabilizing media. Such compounds are characterized by having a pair of oxime groups and may have the general formula:

$$\begin{array}{l} R_1-C=N-OH \\ \quad\;\; | \\ R_2-C=N-OH \end{array}$$

where $R_1$ and $R_2$ are the same or different alkyl groups (preferably having one to eight carbon atoms), cycloaliphatic groups, or aromatic groups.

The dioximes are believed to react with palladium present as a colloidal coating upon the substrate to form a complex of the following general formula:

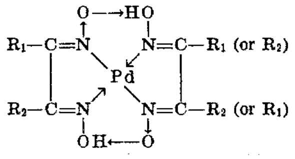

A preferred dioxime for use in the formation of a destabilizing medium is diacetyldioxime, sometimes identified as dimethylglyoxime, or 2,3-diisonitrosobutane, having the formula:

$$\begin{array}{l} CH_3-C=N-OH \\ \quad\;\;\;\; | \\ CH_3-C=N-OH \end{array}$$

If desired a minor amount of hydrochloric acid may be added to solutions of this compound to form a particularly satisfactory destabilizing medium. The diacetyldioxime solutions strip the noble metal (e.g. palladium) from the colloidal coating to form a yellow insoluble complex which is believed to have approximately the following formula:

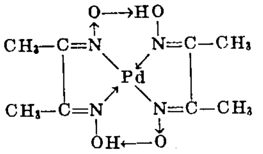

which may be termed palladium-diacetyldioxime.

Other representative dioximes which may be selected for use in the formation of destabilizing media together with their structural formulas are listed below:

(a) Benzenedioxime
$$\begin{array}{l} C_6H_5-C=N-OH \\ \quad\quad | \\ C_6H_5-C=N-OH \end{array}$$

(b) Methylenebenzoylglydioxime
$$\begin{array}{l} CH_3-C=N-OH \\ \quad\quad | \\ C_6H_5-CO-C=N-OH \end{array}$$

(c) α-furyldioxime
$$\begin{array}{l} C_5H_3-O-C=N-OH \\ \quad\quad | \\ C_5H_3-O-C=N-OH \end{array}$$

(d) Diaminodioxime
$$\begin{array}{l} NH_2-C=N-OH \\ \quad\quad | \\ NH_2-C=N-OH \end{array}$$

(e) 1,2-cyclohexandiondioxime
$$\begin{array}{l} CH_2-CH_2-C=N-OH \\ \quad\quad | \\ CH_2-CH_2-C=N-OH \end{array}$$

Solutions containing a minor amount of oxine, sometimes identified as 8-hydroxyquinoline, having the formula:

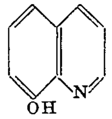

, may be chosen as the destabilizing medium for the noble metal colloid, e.g. palladium. This compound which is widely used as a reagent in the analysis of metals is capable of forming insoluble metallic compounds by substituting a metallic group of the hydrogen in the —OH group. The solubility of the metallic compounds formed varies with temperature, concentration, etc., as will be apparent to those skilled in the art. It is believed that two molecules of oxine react with the noble metal colloid (e.g. palladium) to form an insoluble metallic compound, and thereby strip the noble metal colloid from selected areas of the substrate.

It is observed that the solutions of organic compounds which act primarily upon the noble metal colloid may serve to remove to some degree noble metal from all portions of the coating. Since, however, a greater quantity of the colloidal coating will inherently adhere to the roughened areas of the surface than to the smooth areas, an adequate thickness of colloidal coating will remain over the roughened areas of the surface after the colloidal coating is completely removed from the smooth areas.

Also the manner in which the noble metal colloid (e.g. palladium) is deposited upon the substrate may explain to some extent why certain organic destabilizing compounds act specifically upon the palladium component. While the mechanism is not completely understood it appears that the inner portion of the colloidal layer contains little or no noble metal, and that the outer portion of the colloidal coating contains a higher proportion of noble metal. No electroless deposition of metal takes place on areas which support residual colloid other than a noble metal (e.g. palladium).

After stripping, the substrate which continues to bear a colloidal coating over selected areas of its surface having a substantial tendency to retain the same is rinsed, so that subsequent treatment baths are not contaminated by residues from the destabilization medium. Water may be conveniently employed to remove traces of the destabilizing medium which if not otherwise removed could possibly interfere with the subsequent electroless deposition reaction.

In a preferred embodiment of the invention the substrate is treated with a buffer solution following rinsing. Satisfactory buffer solutions are aqueous hydrochloric acid solutions containing a minor amount of dissolved sodium chloride. A particularly preferred buffer solution is formed by dissolving about 50 ml. of concentrated hydrochloric acid, and about 10 grams of sodium chloride per liter of water. The substrate is again rinsed with water following treatment with the buffer solution.

Electroless Deposition

The selected areas of the surface of the substrate bearing a coating of a colloidal material which is catalytic to the metal to be deposited may next be coated with a metal electrolessly. The electroless deposition may be conducted in accordance with conventional techniques which are well known in the art. The deposition of a metal electrolessly upon the areas which retain the catalytic colloid is not altered by the fact that the substrate has previously been subjected to a destabilizing medium.

Copper is commonly the metal applied electrolessly. Known electroless copper deposition solutions contain basically four ingredients dissolved in water. These are (1) a source of cupric ions usually copper sulfate, (2) formaldehyde as reducing agent therefor, (3) alkali, generally an alkali metal hydroxide and usually sodium hydroxide, sufficient to provide the required alkaline solution in which the compositions are effective, and (4) a complexing agent for the copper sufficient to prevent its precipitation in alkaline solution. Numerous complexing agents for use in such compositions are known. For instance, U.S. Pat. No. 3,011,920 discloses the use of tartrates in the form of Rochelle salts. Salicylates are disclosed in U.S. Pat. No. 2,874,072. Acid substitution diamines and triamines are disclosed in U.S. Pat. Nos. 3,075,856 and 3,119,709. Alkanolamines are disclosed in U.S. Pat. No. 3,075,855. Hydroxy-alkyl substituted dialkylene triamines are disclosed in U.S. Pat. No. 3,383,224. Each of the above-mentioned patents may be referred to for further details, and are herein incorporated by reference.

Examples of known metal deposition solutions for copper, nickel and cobalt are given below:

Copper

| | | Grams |
|---|---|---|
| A. | Rochelle salts | 170 |
| | NaOH | 50 |
| | $CuSO_4 \cdot 5H_2O$ | 35 |
| | Water to make 1 liter | |
| B. | Formaldehyde (37% by wt.). | |
| | Mix 5 to 8 parts A per part B by volume immediately prior to use. For example, 6 parts A. | |

Nickel

| | Ounces |
|---|---|
| $NiCl_2 \cdot 6H_2O$ | 4 |
| $NaH_2PO_2 \cdot H_2O$ | 1.3 |
| Sodium citrate | 1.3 |
| Water to make 1 gal. | |
| Operate at 194° F. and pH 4 to 6. | |

Cobalt

| | Ounces |
|---|---|
| $CoCl_2 \cdot 6H_2O$ | 4 |
| $NaH_2PO_2 \cdot H_2O$ | 1.3 |
| Sodium citrate | 1.3 |
| Water to make 1 gal. | |
| Operate at 194° F. and pH 9 to 10. Adjust pH with $NH_4OH$. | |

The substrate bearing a metal deposited electrolessly upon selected areas of its surface may next receive an additional metal coating over the same surface by electrodeposition. The additional metal (e.g. copper from a copper sulfate solution) may be deposited by passage of a current through an electroplating bath with the metal previously applied electrolessly serving as the cathode. Conventional electrodeposition techniques may be utilized as will be apparent to those skilled in the art.

As previously indicated, the resulting articles may be utilized in printed circuit applications. Alternatively, the metal coating may be provided upon selected areas of a substrate surface for decorative purposes.

The following examples are given as specific illustrations of the invention. It should be understood, however, that the invention is not limited to the specific details set forth in the examples.

EXAMPLE 1

A phenolic resin (phenol-formaldehyde resin)-cardboard laminate of the type commonly used in the formation of printed circuit boards is selected. During the formation of the substrate its surface was rolled and pressed to a uniform thickness and a surface roughness of about 4 to 8 $\mu$m. Holes are next drilled through the substrate as is common in the production of printed circuit boards. The walls of the holes exhibit a surface roughness of about 12 $\mu$m. The board is degreased by placement in a container of an organic solvent, e.g. methyl chloroform, and rinsed in running water for 3 minutes at ambient temperature (e.g. 25° C.).

An aqueous bath containing colloidal stannous chloride is prepared by the admixture of 50 grams of stannous chloride and 60 ml. of concentrated hydrochloric acid per liter of water. The cleaned and rinsed board having divergent surface characteristics (i.e. a greater surface roughness on the walls of the through holes) is immersed in the colloidal stannous chloride bath at ambient temperature (e.g. 25° C.) for approximately 3 minutes. A thin coating (i.e. film) of colloidal stannous chloride is thereby deposited upon all surfaces of the board including the walls of the holes. The coated board bearing a sensitized surface is next rinsed in water at ambient temperature (e.g. 25° C.) for approximately 3 minutes.

An aqueous destabilizing bath or stripper is formed by dissolving 4 grams of basic lead carbonate, $2PbCO_3 \cdot Pb(OH)_2$, and 5 ml. of concentrated hydrochloric acid per liter of water. The board bearing the coating of colloidal stannous chloride is immersed in the destabilizing bath at ambient temperature (e.g. 25° C.) until the colloidal coating is removed from all portions of the board surface with the exception of the walls of the holes. It is observed that the colloidal stannous chloride coating on the walls of the holes is up to 10 times more resistant to destabilization than the corresponding colloidal stannous chloride coating on the other surfaces of the board. The board bearing a coating of colloidal stannous chloride over selected areas is next rinsed in water at ambient temperature (e.g. 25° C.) for at least 3 minutes to remove the destabilizing medium.

An aqueous bath containing a salt of a noble metal is prepared by dissolving 0.5 gram palladium chloride, $PdCl_2$, and 5 ml. of concentrated hydrochloric acid per liter of water. The board is next immersed in the palladium chloride bath at ambient temperature (e.g. 25° C.) wherein a thin layer of metallic palladium is selectively deposited upon the surface of the walls of the holes in a thickness of about 0.1 $\mu$m. Stannous, $Sn^{+2}$, ions of the colloidal coating are oxidized to stannic ions, $Sn^{+4}$, and the palladium ions are reduced to metallic palladium. The noble metal, palladium, is catalytic to the metal which is to be deposited electrolessly (i.e. copper).

After rinsing in water, the walls of the holes may next be selectively electrolessly coated with copper by standard electroless deposition techniques, such as by immersion in the aqueous electroless copper plating solutions identified heretofore. An additional coating of copper may next be electroplated upon the same to increase its thickness.

EXAMPLE 2

A glass-fiber-reinforced epoxy resin card of the type commonly used in the production of printed circuit boards having dimensions of approximately 6×10 inches and having a sheet of copper foil laminated upon one side is provided in a cleaned and degreased form. The card is provided with a plurality of holes having a diameter of 2 mm. which were conventionally drilled at a drilling speed of about 4,000 r.p.m. A greater roughness exists on the walls of the holes than upon the other surfaces of the card. The water adsorption of the card does not exceed 0.75 percent by weight.

A one step activation procedure is accomplished at ambient temperature, e.g. 25° C., for 3 minutes by immersing the card in a bath formed in accordance with example 1 of U.S. Pat. No. 3,011,920, which is herein incorporated by reference. The activation bath consists of the following ingredients:

| | |
|---|---|
| $PdCl_2$ | 1 gram |
| Water | 600 ml. |
| HCl (concentrated) | 300 ml. |
| $SnCl_2$ | 50 gm. |

The activation bath is commercially available in concentrated form under the designating "6F" from the Shipley Company, Inc. of Newton, Massachusetts. Two parts by volume of the concentrate may be mixed with 1 part by volume concentrated hydrochloric acid, and 3 parts by volume distilled water to form the above-identified activation bath. A thin layer of a colloidal material catalytic to the metal to be deposited electrolessly is deposited from the activation bath upon all surfaces of the card. A colloidal palladium coating is formed upon the surfaces of the card by the reduction of palladium ions by the stannous ions of the stannous chloride. Simultaneously, stannic acid colloids are formed, together with adsorbed stannic oxychloride and stannic chloride. The stannic acid colloids comprise protective colloids for the palladium colloids while the oxychloride constitutes a deflocculating agent further promoting the stability of the resulting colloidal solution.

The card bearing the colloidal coating is rinsed in running tap water having a temperature of about 10° C. for 1 minute.

The card is immersed in a destabilizing medium or stripper at ambient temperature, e.g. 25° C., for 1 minute consisting of 30 grams of oxalic acid per liter of water.

The card is rinsed by placement in running tap water at ambient temperature, e.g. 25° C., for 3 minutes The colloidal palladium coating is effectively removed from all portions of the card surface with the exception of the walls of the holes, where a substantial quantity of the palladium colloidal coating is retained.

The card is dipped for 1 minute in a buffer solution at ambient temperature, e.g. 25° C., comprising:

| | |
|---|---|
| Sodium chloride | 10 grams |
| HCl (concentrated) | 50 ml. |
| Water | 1 liter |

After again rinsing in running tap water the walls of the holes may next be selectively electrolessly coated with copper by standard electroless deposition techniques. For example, electroless plating baths and plating techniques may be selected as described in the examples of U.S. Pat. No. 3,383,224 to Dutkewych which is herein incorporated by reference. Such electroless copper plating baths are commercially available in concentrated form under the designation "-Coposit 523 Copper Mix" from the Shipley Company, Inc. of Newton, Massachusetts, and may comprise upon dilution with distilled water:

| | |
|---|---|
| $CuSO_4 \cdot H_2O$ | 10.0 grams |
| Paraformaldehyde | 9.3 grams |
| NaOH | 25.0 grams |

| | |
|---|---|
| Complexing Agent: | |
| Pentahydroxypropyldiethylene triamine | 5 grams |
| Sodium tartrate | 9.9 grams |
| Distilled Water | Quantity sufficient to make a total of 1 liter |

The card may be immersed in the electroless deposition bath for 5 minutes. Copper is deposited only upon the walls of the holes.

EXAMPLE 3

Example 2 is repeated with the exception that the substrate is a paper-reinforced phenolic resin (phenol-formaldehyde resin) card of the type commonly used in the production of printed circuit cards having dimensions of approximately 6×10 inches, and a sheet of copper foil laminated on one side. Substantially similar results are achieved.

EXAMPLE 4

Example 2 is repeated with the exception that the card is immersed in the oxalic acid destabilizing medium or stripper for 5 minutes. Substantially similar results are achieved.

EXAMPLE 5

Example 2 is repeated with the exception that the card is immersed in the oxalic acid destabilizing medium for 20 minutes. Substantially similar results are achieved.

EXAMPLE 6

Example 2 is repeated with the following exceptions. The surface of a glass-fiber-reinforced epoxy resin card of the type commonly used in the production of printed circuits having dimensions of approximately 6×10 inches is roughened on one side by sand blasting. Through the use of silk screen printing a negative pattern for the desired printed circuit is printed upon the sand blasted surface with epoxy resin lacquer employing trichlorethylene as solvent, and dried at 70° C. Holes of 2 mm. diameter are drilled through the card at a drilling speed of about 4,000 r.p.m. The roughness exhibited by the walls of the holes approximates that of the exposed portion of the sand blasted surface. Copper is deposited electrolessly only upon the roughened surface not covered by the negative pattern, and upon the walls of the holes. Printed circuit cards having conductive holes as well as a circuit pattern are accordingly obtained in a single step.

EXAMPLE 7

Example 2 is repeated with the following exceptions. A conductive printed circuit pattern of tin-lead alloy is formed upon both surfaces of an epoxy resin card according to prior art techniques. The surface of the card is completely covered with an epoxy resin lacquer employing trichlorethylene as solvent, and dried at 70° C. Holes of 2 mm. diameter are drilled through the coated card at a drilling speed of about 4,000 r.p.m. Copper is deposited electrolessly only upon the walls of the holes. Copper may additionally be electroplated in an electrocopper bath in order to provide copper of increased thickness upon the walls of the holes. After removal of the epoxy resin lacquer coating the circuit is ready for use.

EXAMPLE 8

Example 2 is repeated with the exception that the destabilizing medium or stripper consists of the following:

| | |
|---|---|
| Anthranilic acid | 4 grams |
| HCl (concentrated) | 25 ml. |
| Water (distilled) | 1 liter |

The immersion time in the stripper is 10 seconds. Substantially similar results are obtained.

EXAMPLE 9

Example 2 is repeated with the exception that the destabilizing medium or stripper consists of a 2 percent by weight solution of diacetyldioxime in ethyl alcohol, and the immersion time in the stripper is 3 minutes. Substantially similar results are obtained.

EXAMPLE 10

Example 2 is repeated with the exception that the surface of the glass fiber reinforced epoxy resin card is roughened with a steel brush at selected areas. Copper is deposited electrolessly upon the surfaces so roughened as well as upon the walls of the holes.

Although the invention has been described with preferred embodiments, it is to be understood that variations and modifications may be resorted to as will be apparent to those skilled in the art. Such variations and modifications are to be considered within the purview and scope of the claims appended hereto.

We claim:

1. An improved process for the preparation of a resinous sheet material to receive a metal coating over a selected area of its surface through electroless deposition comprising:

a. providing a resinous sheet material having areas of divergent surface characteristics consisting essentially of:
   1. a planar area having no substantial tendency to retain an adsorbed colloid, and
   2. an area defined by the wall of at least one through hole which penetrates said resinous material having a substantial tendency to retain an adsorbed colloid, b. contacting the surface of said resinous sheet material with a colloidal suspension of stannous chloride wherein said surface is coated with colloidal stannous chloride, c. contacting said resinous sheet material bearing said coating of colloidal stannous chloride with a solution of an electrolyte capable of destabilizing said colloidal stannous chloride for a time sufficient to substantially remove said colloidal stannous chloride from said planar area while preserving said colloidal stannous chloride upon the wall of said through hole, said solution being an aqueous solution of basic lead carbonate and hydrochloric acid, and d. contacting said resulting resinous sheet material with a solution of a noble metal salt capable of rendering the wall of said through hole catalytic to the deposition of electroless metal.

2. An improved process according to claim 1 wherein said solution comprises an aqueous solution of basic lead carbonate and hydrochloric acid comprising about 1 to 10 grams of basic lead carbonate and about 1 to 10 ml. of hydrochloric acid per liter of water, and said resinous sheet material is exposed to said solution for 1 to 10 minutes.

3. An improved process for the preparation of a resinous sheet material to receive a metal coating over a selected area of its surface through electroless deposition comprising:

a. providing a resinous sheet material having areas of divergent surface characteristics consisting essentially of:
   1. a planar area having no substantial tendency to retain an adsorbed colloid, and
   2. an area defined by the walls of at least one through hole which penetrates said resinous sheet material having a substantial tendency to retain an adsorbed colloid, b. contacting said surface of said resinous sheet material with a colloidal suspension of stannous chloride and a noble metal wherein said surface is coated with a colloidal coating of a noble metal which is catalytic to the electroless deposition of metal, and c. contacting said resinous sheet material bearing said colloidal coating with a solution of an organic compound capable of destabilizing said noble metal by reaction therewith for a time sufficient to substantially render said planar area noncatalytic to the electroless deposition of metal through the removal of said noble metal while preserving said noble metal upon the walls of said through holes, said organic compound solution being an aqueous oxalic acid solution formed by dissolving about 2 to 50 grams of oxalic acid per liter of water, and said exposure to said solution ranging from about 20 seconds to 5 minutes.

4. An improved process for the preparation of a resinous sheet material to receive a metal coating over a selected area of its surface through electroless deposition comprising:
 a. providing a resinous sheet material having areas of divergent surface characteristics consisting essentially of:
  1. a planar area having no substantial tendency to retain an adsorbed colloid, and
  2. an area defined by the walls of at least one through hole which penetrates said resinous sheet material having a substantial tendency to retain an adsorbed colloid,
 b. contacting said surface of said resinous sheet material with a colloidal suspension of stannous chloride and a noble metal salt wherein said surface is coated with a colloidal coating of a noble metal which is catalytic to the electroless deposition of metal, and
 c. contacting said resinous sheet material bearing said colloidal coating with a solution of a dioxime capable of destabilizing said noble metal by reaction therewith for a time sufficient to substantially render said planar area noncatalytic to the electroless deposition of metal through the removal of said noble metal while preserving said noble metal upon the walls of said through hole.

5. An improved process according to claim 4 wherein said dioxime is diacetyldioxime.

6. An improved process for the preparation of a resinous material to receive a metal coating over a selected area of its surface through electroless deposition comprising:
 a. providing a resinous sheet material having areas of divergent surface characteristics consisting essentially of:
  1. a planar area having no substantial tendency to retain an adsorbed colloid, and
  2. an area defined by the walls of at least one through hole which penetrates said resinous sheet material having a substantial tendency to retain an adsorbed colloid,
 b. contacting said surface of said resinous sheet material with a colloidal suspension of stannous chloride and a noble metal salt wherein said surface is coated with a colloidal coating of a noble metal which is catalytic to the electroless deposition of metal, and
 c. contacting said resinous sheet material bearing said colloidal coating with a solution of anthranilic acid capable of destabilizing said noble metal by reaction therewith for a time sufficient to substantially render said planar area noncatalytic to the electroless deposition of metal through the removal of said noble metal while preserving said noble metal upon the walls of said through hole.

7. An improved process for the preparation of a resinous sheet material to receive a metal coating over a selected area of its surface through electroless deposition comprising:
 a. providing a resinous sheet material having areas of divergent surface characteristics consisting essentially of:
  1. a planar area having no substantial tendency to retain an adsorbed colloid, and
  2. an area defined by the walls of at least one through hole which penetrates said resinous sheet material having a substantial tendency to retain an adsorbed colloid,
 b. contacting said surface of said resinous sheet material with a colloidal suspension of stannous chloride and a noble metal salt wherein said surface is coated with a colloidal coating of a noble metal which is catalytic to the electroless deposition of metal, and
 c. contacting said resinous sheet material bearing said colloidal coating with a solution of 8 -hydroxyquinoline capable of destabilizing said noble metal by reaction therewith for a time sufficient to substantially render said planar area noncatalytic to the electroless deposition of metal through the removal of said noble metal while preserving said noble metal upon the walls of said through hole.

8. An improved process for the preparation of a resinous sheet material to receive a metal coating over a selected area of its surface through electroless deposition comprising:
 a. providing a resinous sheet material having areas of divergent surface characteristics consisting essentially of:
  1. a planar area having no substantial tendency to retain an adsorbed colloid, and
  2. an area defined by the walls of at least one through hole which penetrates said resinous sheet material having a substantial tendency to retain an adsorbed colloid,
 b. contacting said surface of said resinous sheet material with a colloidal suspension of stannous chloride and a noble metal salt wherein said surface is coated with a colloidal coating of a noble metal which is catalytic to the electroless deposition of metal,
 c. contacting said resinous sheet material bearing said colloidal coating with a solution of an organic compound capable of destabilizing said noble metal by reaction therewith for a time sufficient to substantially render said planar area noncatalytic to the electroless deposition of metal through the removal of said noble metal while preserving said noble metal upon the walls of said through hole, and
 d. contacting said resinous sheet material with an aqueous hydrochloric acid solution containing a minor amount of dissolved sodium chloride following contact with said solution of an organic compound capable of destabilizing said noble metal by reaction therewith.

9. An improved process for the preparation of a resinous sheet material to receive a metal coating over a selected area of its surface through electroless deposition comprising:
 a. providing a resinous sheet material having areas of divergent surface characteristics consisting essentially of:
  1. a planar area having no substantial tendency to retain an adsorbed colloid, and
  2. an area defined by the wall of at least one through hole which penetrates said resinous sheet material having a substantial tendency to retain an adsorbed colloid,
 b. contacting the surface of said resinous sheet material with a colloidal suspension of stannous chloride wherein said surface is coated with colloidal stannous chloride,
 c. contacting said resinous sheet material bearing said coating of colloidal stannous chloride with a solution of an electrolyte capable of destabilizing said colloidal stannous chloride for a time sufficient to substantially remove said colloidal stannous chloride from said planar area while preserving said colloidal stannous chloride upon the wall of said through hole, said solution being an aqueous solution of ferric chloride, and
 d. contacting said resulting resinous sheet material with a solution of a noble metal salt capable of rendering the wall of said through hole catalytic to the deposition of electroless metal.

10. An improved process for the preparation of a resinous sheet material to receive a metal coating over a selected area of its surface through electroless deposition comprising:
 a. providing a resinous sheet material having areas of divergent surface characteristics consisting essentially of:
  1. a planar area having no substantial tendency to retain an adsorbed colloid, and
  2. an area defined by the wall of at least one through hole which penetrates said resinous sheet material having a substantial tendency to retain an adsorbed colloid,
 b. contacting the surface of said resinous sheet material with a colloidal suspension of stannous chloride wherein said surface is coated with colloidal stannous chloride,
 c. contacting said resinous sheet material bearing said coating of colloidal stannous chloride with a solution of an electrolyte capable of destabilizing said colloidal stannous chloride for a time sufficient to substantially remove said colloidal stannous chloride from said planar area while preserving said colloidal stannous chloride upon the wall of said through hole, said solution being an aqueous solution of aluminum sulfate, and d. contacting said resulting resinous sheet material with a solution of a noble metal salt capable of rendering the wall of said through hole catalytic to the deposition of electroless metal.

11. An improved process for the preparation of a resinous sheet material to receive a metal coating over a selected area of its surface through electroless deposition comprising:

a. providing a resinous sheet material having areas of divergent surface characteristics consisting essentially of:
  1. a planar area having no substantial tendency to retain an adsorbed colloid, and
  2. an area defined by the walls of at least one through hole which penetrates said resinous sheet material having a substantial tendency to retain an adsorbed colloid, b. contacting said surface of said resinous sheet material with a colloidal suspension of stannous chloride and a noble metal salt wherein said surface is coated with a colloidal coating of a noble metal which is catalytic to the electroless deposition of metal, and contacting said resinous sheet material bearing said colloidal coating with a solution of a dibasic carboxylic acid having the general formula $$\begin{array}{c}COOH\\ |\\ (CH_2)_n\\ |\\ COOH\end{array}$$

where $n$ is a whole number from 1 to about 8, capable of destabilizing said noble metal by reaction therewith for a time sufficient to substantially render said planar area noncatalytic to the electroless deposition of metal through the removal of said noble metal while preserving said noble metal upon the walls of said through hole.

12. An improved process for the preparation of a resinous sheet material to receive a metal coating over a selected area of its surface through electroless deposition comprising:

a. providing a resinous sheet material having areas of divergent surface characteristics consisting essentially of:
  1. a planar area having no substantial tendency to retain an adsorbed colloid, and
  2. an area defined by the walls of at least one through hole which penetrates said resinous sheet material having a substantial tendency to retain an adsorbed colloid, b. contacting said surface of said resinous sheet material with a colloidal suspension of stannous chloride and a noble metal salt wherein said surface is coated with a colloidal coating of a noble metal which is catalytic to the electroless deposition of metal, and c. contacting said resinous sheet material bearing said colloidal coating with a solution of oxalic acid capable of destabilizing said noble metal by reaction therewith for a time sufficient to substantially render said planar area noncatalytic to the electroless deposition of metal through the removal of said noble metal while preserving said noble metal upon the walls of said through hole.

* * * * *